(12) United States Patent
Nomura et al.

(10) Patent No.: US 8,080,939 B2
(45) Date of Patent: Dec. 20, 2011

(54) REFLECTION PLATE, LIGHT-EMITTING DEVICE AND METHOD OF MANUFACTURING REFLECTION PLATE

(75) Inventors: Yu Nomura, Miyagi (JP); Hiroyuki Kiso, Miyagi (JP); Tatsuya Watanabe, Tokyo (JP)

(73) Assignee: Sony Corporation, Tokyo (JP)

( * ) Notice: Subject to any disclaimer, the term of this patent is extended or adjusted under 35 U.S.C. 154(b) by 197 days.

(21) Appl. No.: 12/578,951

(22) Filed: Oct. 14, 2009

(65) Prior Publication Data

US 2010/0090595 A1    Apr. 15, 2010

(30) Foreign Application Priority Data

Oct. 15, 2008    (JP) ............................... P2008-265954

(51) Int. Cl.
*H01J 1/62*         (2006.01)
(52) U.S. Cl. ...................................... 313/506
(58) Field of Classification Search .................. 313/113, 313/114, 498, 504, 506, 509
See application file for complete search history.

(56) References Cited

U.S. PATENT DOCUMENTS

| 6,091,384 A | 7/2000 | Kubota et al. |
| 2005/0253788 A1 | 11/2005 | Benoit et al. |

FOREIGN PATENT DOCUMENTS

| JP | 3573393 | 7/1996 |
| JP | 2005531102 | 10/2005 |

*Primary Examiner* — Vip Patel
(74) *Attorney, Agent, or Firm* — K&L Gates LLP

(57) ABSTRACT

A reflection plate allowing the prevention of the generation of stray light, a method of manufacturing the same, and a light-emitting device using such a reflection plate are provided. The reflection plate includes: a base having light transparency, and having a plurality of projections formed on a surface thereof; a reflecting mirror film arranged so as to be laid over a side surface of each of the projections in the base; and a light absorption layer arranged in a part or the whole of each of depressions on the surface of the base, the depressions being formed in spaces between the plurality of projections.

13 Claims, 18 Drawing Sheets

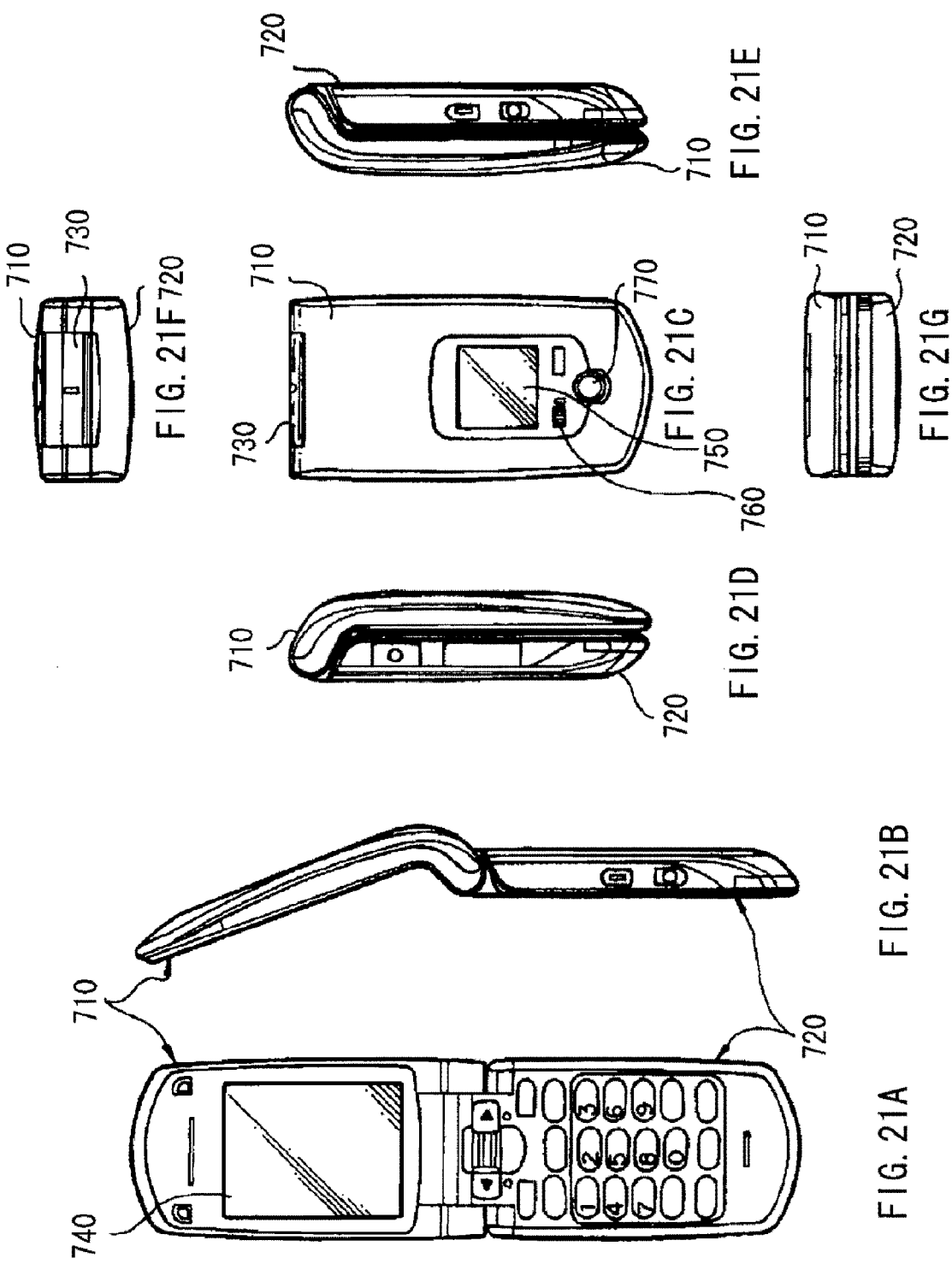

REFLECTION PLATE, LIGHT-EMITTING DEVICE AND METHOD OF MANUFACTURING REFLECTION PLATE

CROSS REFERENCES TO RELATED APPLICATIONS

The present application claim priority to Japanese Priority Patent Application JP 2008-265954 filed in the Japan Patent Office on Oct. 15, 2008, the entire content of which is hereby incorporated by reference.

BACKGROUND

The present application relates to a reflection plate used as, for example, a reflector of a self-luminous device such as an organic EL (Electroluminescence) device, a method of manufacturing the reflection plate and a light-emitting device using the reflection plate.

A self-luminous device such as an organic EL device includes a first electrode, an organic layer including a light-emitting layer and a second electrode in order on a substrate, and when a DC voltage is applied between the first electrode and the second electrode, electron-hole recombination occurs in the light-emitting layer to emit light. The emitted light may be extracted from, for example, the second electrode side, that is, from a side opposite to a side where a circuit including a TFT (Thin Film Transistor) or wiring is arranged so as to increase an aperture ratio. In the case where light is extracted from the second electrode side, a high reflective metal electrode is typically used as the first electrode.

In a light-emitting device in which a plurality of such organic EL devices are formed, a refractive index in the inside of the light-emitting device is high (for example, a refractive index of 1.5 or over), so total reflection easily occurs at an interface with an air layer (with a refractive index of 1.0). Therefore, it is difficult to sufficiently extract emitted light to outside. Therefore, a technique of arranging a reflection plate (reflector) on a light extraction side of an organic EL device has been proposed as described in Japanese Patent No. 3573393 and Published Japanese Translation No. 2005-531102 of PCT international application. In such a reflector, a plurality of projections are formed on a surface of a base so as to correspond to organic EL devices arranged, and a side surface of each projection is covered with a reflecting mirror film.

SUMMARY

In the above-described reflector, spaces (depressions) between a plurality of projections form space layers having an atmosphere (for example, air, nitrogen or vacuum) at the time of sealing. In this case, a part of light which is emitted from a light-emitting layer and enters into the space layer is totally reflected at an interface with the space layer. Such light is stray light causing degradation in display quality. Therefore, it is desired to achieve a reflector preventing the generation of stray light.

It is desirable to provide a reflection plate allowing the prevention of the generation of stray light, a method of manufacturing the reflection plate, and a light-emitting device using such a reflection plate.

According to an embodiment, there is provided a reflection plate including: a base having light transparency, and having a plurality of projections formed on a surface thereof; a reflecting mirror film arranged so as to be laid over a side surface of each of the projections in the base; and a light absorption layer arranged in a part or the whole of each of depressions on the surface of the base, the depressions being formed in spaces between the plurality of projections.

According to an embodiment, there is provided a method of manufacturing a reflection plate including steps of: forming a base having light transparency and having a plurality of projections on a surface thereof; forming a reflecting mirror film on the surface of the base along the shape of each of the projections; forming a light absorption layer on the surface where the reflecting mirror film is formed of the base; and forming openings in regions facing end surfaces of the projections in the reflecting mirror film and the light absorption layer.

In the reflection plate and the method of manufacturing a reflection plate according to an embodiment, when light enters into a side where the projections and the depressions are formed of the base, a part of the incident light enters into the projections of the base, and travels inside the base in a straight line as it is, or is reflected by the reflecting mirror film formed on side surfaces of the projections to be emitted from the back surface of the base. On the other hand, the light absorption layer is arranged in the depressions formed in spaces between the plurality of projections, so light having entered into the depressions in the incident light from the surface of the base is absorbed by the light absorption layer.

According to an embodiment, there is provided a light-emitting device including: a light-emitting panel including a plurality of self-luminous devices on a substrate; and the reflection plate according to the above-described embodiment.

In the reflection plate and the method of manufacturing a reflection plate according to an embodiment, the reflecting mirror film is arranged so as to be laid over a side surface of each of the plurality of projections formed on the surface of the base, and the light absorption layer is arranged in the depressions formed in spaces between the plurality of projections, so total reflection at an interface in the case where the depressions form space layers is prevented. Therefore, the generation of stray light is allowed to be prevented.

Additional features and advantages are described herein, and will be apparent from the following Detailed Description and the figures.

BRIEF DESCRIPTION OF THE FIGURES

FIGS. 21A to 21G illustrate Application Example 5, FIGS. 21A and 21B are a front view and a side view in a state in which Application Example 5 is opened, respectively, and FIGS. 21C, 21D, 21E, 21F and 21G are a front view, a left side view, a right side view, a top view and a bottom view in a state in which Application Example 5 is closed, respectively.

DETAILED DESCRIPTION

The present application will be described in detail below referring to the accompanying drawings according to an embodiment.

Figure 1:
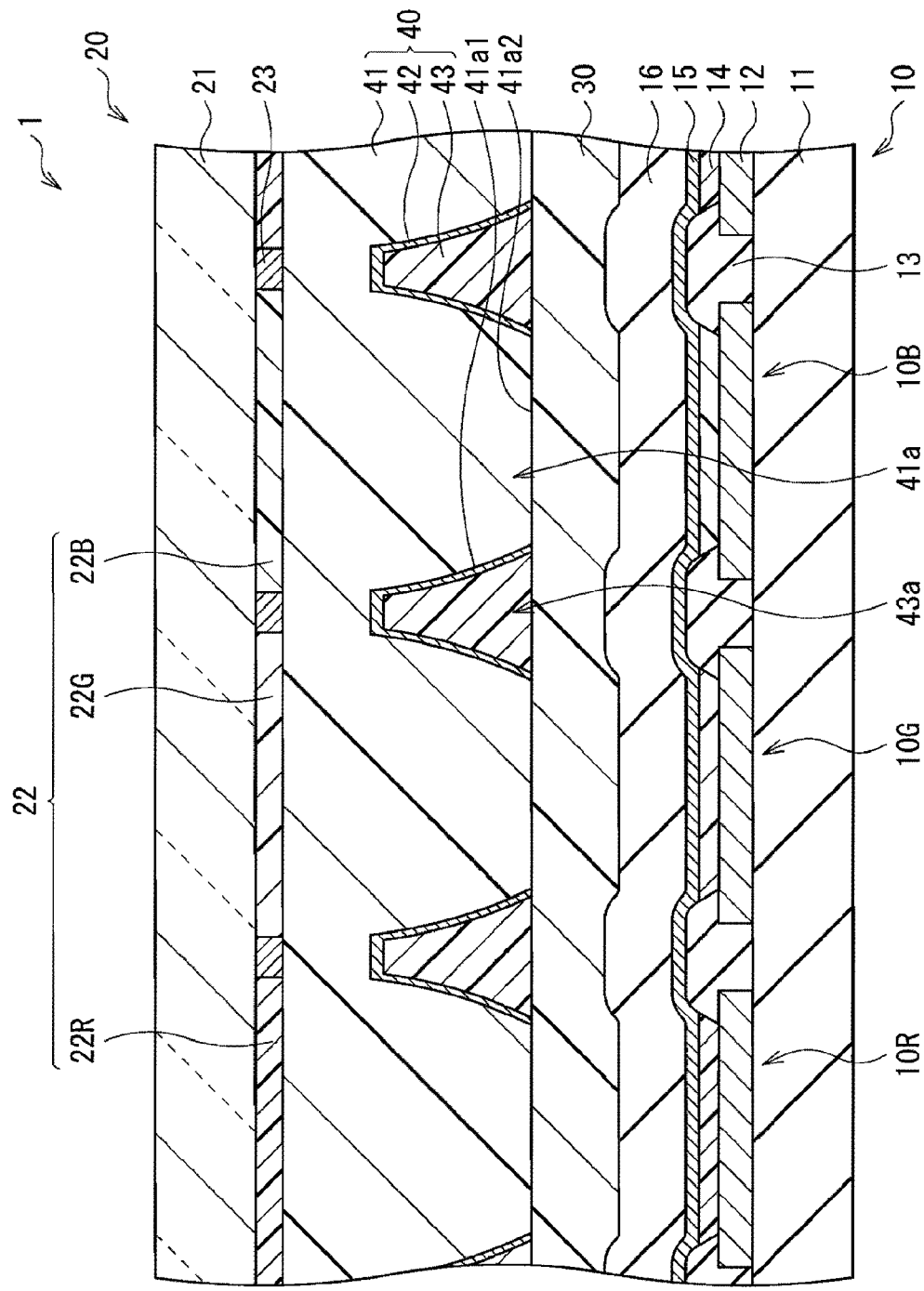
FIG. 1 is a schematic sectional view of a light-emitting device according to an embodiment of the invention.

FIG. 1 illustrates a sectional view of a light-emitting device 1 according to an embodiment of the invention. The light-emitting device 1 is used as a flat-type organic light-emitting color display or the like. In the light-emitting device 1, a drive panel 10 and a sealing panel 20 are bonded together with a reflector 40 (a reflection plate) in between. An adhesive layer 30 made of a thermosetting resin or an ultraviolet curable resin is arranged between the reflector 40 and the drive panel 10.

In the drive panel 10, organic light-emitting devices 10R emitting red light, organic light-emitting devices 10G emitting green light and organic light-emitting devices 10B emitting blue light are formed in order in a matrix form on a drive substrate 11. The drive substrate 11 includes, for example, a TFT (Thin Film Transistor) or the like.

Figure 2:
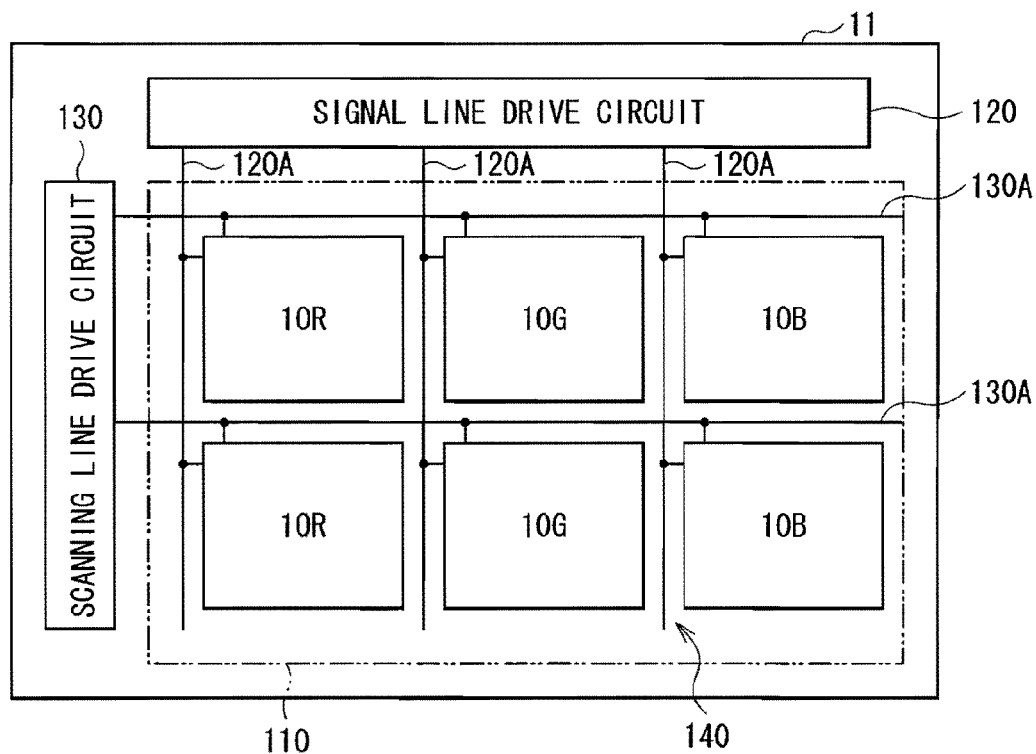
FIG. 2 is an illustration of a circuit configuration of a drive substrate illustrated in FIG. 1.
Figure 3:
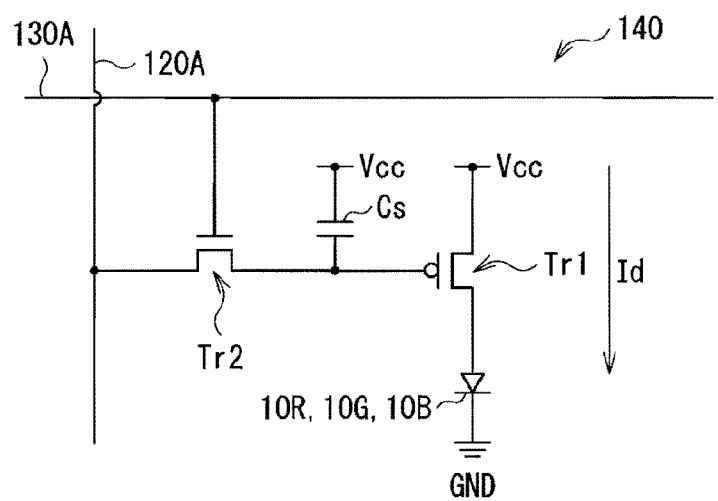
FIG. 3 is an equivalent circuit diagram illustrating an example of a pixel drive circuit illustrated in FIG. 1.

FIG. 2 illustrates an example of a circuit configuration in the drive substrate 11. Moreover, FIG. 3 illustrates an example of a pixel drive circuit 140. As illustrated in the drawings, in the drive substrate 11, a signal line drive circuit 120 and a scanning line drive circuit 130 as drivers for picture display are arranged around a display region 110 including the above-described organic light-emitting devices 10R, 10G and 10B, and in the display region 110, a pixel drive circuit 140 is formed. The pixel drive circuit 140 is formed below a first electrode 12 which will be described later, and the pixel drive circuit 140 is an active drive circuit including a driving transistor Tr1 and a writing transistor Tr2, a capacitor (retention capacitor) Cs between the driving transistor Tr1 and the writing transistor Tr2, the organic light-emitting device 10R (or 10G or 10B) connected to the driving transistor Tr1 in series between a first power source line (Vcc) and a second power source line (GND). The driving transistor Tr1 and the writing transistor Tr2 each are composed of a typical thin film transistor (TFT), and the TFT may have, for example, an inverted stagger configuration (a so-called bottom gate type) or a stagger configuration (a top gate type), and the configuration of the TFT is not specifically limited.

In the pixel drive circuit 140, a plurality of signal lines 120A are arranged in a column direction, and a plurality of scanning lines 130A are arranged in a row direction. An intersection between each signal line 120A and each scanning line 130A corresponds to one (a subpixel) of the organic light-emitting devices 10R, 10G and 10B. Each signal line 120A is connected to the signal line drive circuit 120, and an image signal is supplied from the signal line drive circuit 120 to a source electrode of the writing transistor Tr2 through the signal line 120A. Each scanning line 130A is connected to the scanning line drive circuit 130, and a scanning signal is sequentially supplied from the scanning line drive circuit 130 to a gate electrode of the writing transistor Tr2 through the scanning line 130A.

The organic light-emitting devices 10R, 10G and 10B each have a configuration in which the first electrode 12 as an anode, an insulating film 13, an organic layer 14 including a light-emitting layer which will be described later, and the second electrode 15 as a cathode are laminated in this order on the drive substrate 11, and if necessary, the organic light-emitting devices 10R, 10G and 10B are covered with a protective film 16. In addition, the drive substrate 11 includes the above-described pixel drive circuit 140 and a planarization layer (not illustrated), and the first electrode 12 is formed on the planarization layer.

The first electrodes 12 are formed so as to correspond to the organic light-emitting devices 10R, 10G and 10B, respectively, and are electrically separated from one another by the insulating film 13. Moreover, the first electrodes 12 have a function as a reflective electrode reflecting light emitted from the light-emitting layer, and it is desirable that the first electrodes 12 have as high reflectivity as possible so as to improve light emission efficiency. The first electrodes 12 each have, for example, a thickness of 100 nm to 1000 nm both inclusive, more specifically a thickness of approximately 500 nm, and are made of aluminum (Al) or an alloy including aluminum (Al), or silver (Ag) or an alloy including silver (Ag). Moreover, the first electrodes 12 may be made of a simple substance or an alloy of any other metal element such as chromium (Cr), titanium (Ti), iron (Fe), cobalt (Co), nickel (Ni), molybdenum (Mo), copper (Cu), tantalum (Ta), tungsten (W), platinum (Pt) or gold (Au).

The insulating film 13 is provided to secure insulation between the first electrode 12 and the second electrode 15 and to accurately have a desired shape of a light emission region, and is made of, for example, an organic material such as photosensitive acrylic, polyimide or polybenzoxazole or an inorganic insulating material such as silicon oxide ($SiO_2$). The insulating film 13 has openings corresponding to light emission regions of the first electrodes 12. The organic layer 14 and the second electrode 15 may be continuously arranged on not only the light emission regions but also on the insulating film 13, but light is emitted only from the openings of the insulating film 13.

The organic layer 14 has, for example, a configuration in which a hole injection layer, a hole transport layer, a light-emitting layer and an electron transport layer are laminated in order from the first electrode 12 side, but any of these layers except for the light-emitting layer may be arranged if necessary. Moreover, the organic layer 14 may have a different configuration depending on the color of light emitted from the organic light-emitting devices 10R, 10G or 10B. The hole injection layer is provided to enhance hole injection efficiency, and is a buffer layer for preventing leakage. The hole transport layer is provided to enhance the hole transport efficiency to the light-emitting layer. The light-emitting layer emits light by the recombination of electrons and holes in response to the application of an electric field. The electron transport layer is provided to enhance electron transport efficiency to the light-emitting layer. In addition, an electron injection layer (not illustrated) made of LiF, $Li_2O$ or the like may be arranged between the electron transport layer and the second electrode 15.

In the organic light-emitting device 10R, examples of the material of the hole injection layer include 4,4'4"-tris(3-methylphenylphenylamino)triphenylamine (m-MTDATA) and 4,4'4"-tris(2-naphthylphenylamino)triphenylamine (2-TNATA), and examples of the material of the hole transport layer include bis[(N-naphthyl)-N-phenyl]benzidine (α-NPD). Moreover, in the organic light-emitting device 10R, examples of the material of the light-emitting layer include an 8-quinolinol aluminum complex ($Alq_3$) mixed with 40 vol % of 2,6-bis[4-[N-(4-methoxyphenyl)-N-phenyl] aminostyryl]naphthalene-1,5-dicarbonitrile (BSN-BCN), and examples of the material of the electron transport layer include $Alq_3$.

In the organic light-emitting device 10G, examples of the material of the hole injection layer include m-MTDATA and 2-TNATA, and examples of the material of the hole transport layer include α-NPD. Moreover, in the organic light-emitting device 10G, examples of the material of the light-emitting layer include $Alq_3$ mixed with 3 vol % of Coumarin6, and examples of the material of the electron transport layer include $Alq_3$.

In the organic light-emitting device 10B, examples of the material of the hole injection layer include m-MTDATA and 2-TNATA, and examples of the material of the hole transport layer include α-NPD. Moreover, in the organic light-emitting device 10B, examples of the material of the light-emitting layer include spiro6Φ, and examples of the material of the electron transport layer include $Alq_3$.

The second electrode 15 has, for example, a thickness of 5 nm to 50 nm both inclusive, and is made of a simple substance or an alloy of a metal element such as aluminum (Al), magnesium (Mg), calcium (Ca) or sodium (Na). Among them, the second electrode 15 is preferably made of an alloy of magnesium and silver (a MgAg alloy) or an alloy of aluminum (Al) and lithium (Li) (an AlLi alloy). Moreover, the second electrode 15 may be made of ITO (indium-tin complex oxide) or IZO (indium-zinc complex oxide).

The protective film 16 has, for example, a thickness of 500 nm to 10000 nm both inclusive, and is made of silicon oxide ($SiO_2$), silicon nitride (SiN) or the like.

The sealing panel 20 includes the adhesive layer 30 as well as a sealing substrate 21 which seals the organic light-emitting devices 10R, 10G and 10B. The sealing substrate 21 is made of a material such as glass which is transparent to light generated in the organic light emitting devices 10R, 10G and 10B. On the sealing substrate 21, for example, a color filter 22 and a light-shielding film 23 as a black matrix are arranged so as to extract light generated in the organic light emitting devices 10R, 10G and 10B and so as to absorb light reflected by the organic light emitting devices 10R, 10G and 10B and wiring therebetween, and thereby to improve contrast.

The color filter 22 may be arranged on either side of the sealing substrate 21. However, the color filter 22 is preferably arranged on a side close to the drive panel 10, because the color filter 22 is not exposed to a surface of the light-emitting device 10, and is protected by the adhesive layer 30. The color filter 22 is arranged on a back surface of a base 41 of the reflector 40, and includes a red filter 22R, a green filter 22G, and a blue filter 22B corresponding to the organic light-emitting devices 10R, 10G and 10B, respectively.

The red filter 22R, the green filter 22G and the blue filter 22B are formed so as to face the organic layer 14 on the drive substrate 11. The red filter 22R, the green filter 22G and the blue filter 22B each are made of a resin mixed with a pigment, and are adjusted by selecting a pigment so that light transmittance in a target red, green or blue wavelength region is high and light transmittance in other wavelength regions is low.

The light-shielding film 23 is arranged along boundaries of the red filter 22R, the green filter 22G and the blue filter 22B. The light-shielding film 23 is made of, for example, one or more black resin films mixed with a black colorant, or one or more thin films made of metal such as chromium (Cr), a metal nitride or a metal oxide.

The reflector 40 is arranged on a light extraction side, that is, the second electrode 15 side of the drive panel 10, and is provided to improve light extraction efficiency from the organic light-emitting devices 10R, 10G and 10B. The reflector 40 includes the base 41, a reflecting mirror film 42 and a light absorption layer 43.

The base 41 has light transparency, and has a plurality of projections 41a formed on a surface thereof. The base 41 is made of, for example, an ultraviolet curable resin material, a thermosetting curing resin or the like. More specifically, as such a resin material, Threebond 3021J (product name) manufactured from ThreeBond Co., Ltd. is used. In addition, the base 41 may be formed by arranging a resin layer made of the above-described resin material on a glass substrate, and then forming the projections 41a in a part of the resin layer or the whole resin layer in a thickness direction.

The plurality of projections 41a are arranged so as to face the organic light-emitting devices 10R, 10G and 10B, respectively. Each projection 41a has a side surface 41a1 with, for example, the shape of a rotationally symmetrical paraboloid and an end surface 41a2 which is a flat surface. As described above, when the side surface 41a1 has the shape of a rotationally symmetrical paraboloid, uniform radiation angle characteristics are exerted in all directions. However, the planar shape of the side surface 41a1 is not limited to the shape of a paraboloid, and may be any other spherical shape or an aspherical shape, and a section of the side surface 41a1 may be linear. Moreover, the shape of the side surface 41a1 is not necessarily rotationally symmetrical, and may be changed in two directions orthogonal to each other. Thereby, for example, when a viewing angle is narrowed in a horizontal direction and widened in a vertical direction, a function of preventing prying eyes in cellular phones or the like is achievable.

The reflecting mirror film 42 is formed over the side surface 41a1 of each projection 41a. The reflecting mirror film 42 reflects light entering from the end surface 41a2 of the projection 41a to correct and emit the light in such an angle direction that total reflection does not occur at an interface with an external air layer. The reflecting mirror film 42 has a thickness of, for example, approximately 50 nm to 200 nm, and is made of a simple substance of aluminum (Al) or silver (Ag) or an alloy including these metals.

The pitch (width) of each projection 41a is, for example, 20 μm to 100 μm, and the thickness of each projection 41a is, for example, 0.5 to 1.0 times as large as the pitch. The pitch of each projection 41a, the thickness of each projection 41a, and the planar shape of the above-described side surface 41a change the radiation angle characteristics of the reflecting mirror film 42, and are appropriately set depending on the application of the light-emitting device 1. For example, in the case where the light-emitting device 1 is applied to a television, they are set so as to have a wide viewing angle, and in the case where the light-emitting device 1 is applied to a cellular phone, they are set so as to have high luminance in a front direction.

A light absorption layer 43 is fully embedded in depressions 43a formed in spaces between the plurality of such projections 41a. The light absorption layer 43 is made of, for example, a black resin material or a material including carbon. More specifically, as the black resin material, GT-7 (product name: manufactured from Canon Chemicals Inc.), Tamiya Color Acrylic Paint (Flat) Flat Black (product name: manufactured from Tamiya Inc.) or any other carbon black-based material is used. Moreover, a black resist for a black matrix of a color filter or the like may be used. In the embodiment, such a light absorption layer 43 is formed so that the whole depressions 43a are filled with the light absorption layer 43.

For example, the above-described light-emitting device 1 is manufactured by the following steps.

First, the organic light-emitting devices 10R, 10G and 10B are formed on the drive substrate 11 to form the drive panel 10. More specifically, first, the pixel drive circuit 140 and the planarization layer (not illustrated) are formed on the drive substrate 11 made of the above-described material, and then the first electrodes 12 made of the above-described material are formed by, for example, a sputtering method, and the first electrodes 12 are patterned into a predetermined shape by photolithography and etching. Next, the whole surface of the drive substrate 11 is coated with a photosensitive resin, and openings are formed in the photosensitive resin by exposure to light and development, and then the photosensitive resin is fired to form the insulating film 13. Next, for example, the organic layer 14 and the second electrode 15 which are made of the above-described materials are formed by, for example, an evaporation method to form the organic light-emitting devices 10R, 10G and 10B, and then the organic light-emitting devices 10R, 10G and 10B are coated with the protective film 16 made of the above-described material. Thereby, the drive panel 10 is formed.

On the other hand, the light-shielding film 23 made of the above-described material is formed on the sealing substrate 21, and then the light-shielding film 23 is patterned into a predetermined shape. Next, the sealing substrate 21 is coated with the material of the red filter 22R by spin-coating or the like, and the material of the red filter 22R is patterned and fired by a photolithography technique to form the red filter 22R. Next, as in the case of the red filter 22R, the blue filter 22B and the green filter 22G are formed in order. Thereby, the sealing panel 20 is formed.

Figure 4A:
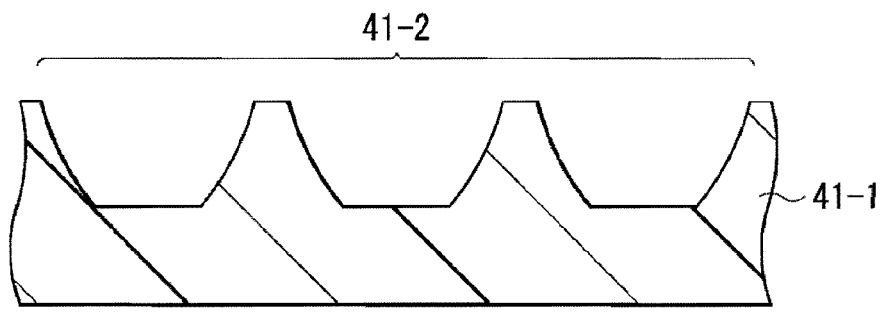
FIGS. 4A and 4B are sectional views illustrating a method of manufacturing the light-emitting device illustrated in FIG. 1 in order of steps.

Next, the reflector 40 is formed on the color filter 22 in the formed sealing panel 20. At this time, first, as illustrated in FIG. 4A, for example, a reverse pattern 41-2 of the plurality of projections 41a is formed on a surface of a master (a stamper) 41-1 made of, for example, polycarbonate (PC) or the like by, for example, a mask imaging method using a KrF excimer laser. Thereby, the stamper 41-1 for pattern transfer is formed.

Figure 4B:
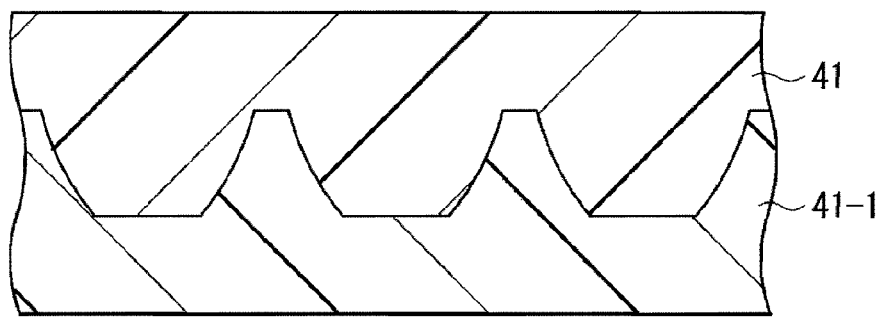

Next, as illustrated in FIG. 4B, a surface (a surface where the reverse pattern 41-2 is formed) of the stamper 41-1 is coated with, for example, an acrylic UV curable resin to form the base 41 made of the acrylic UV curable resin.

Figure 5A:
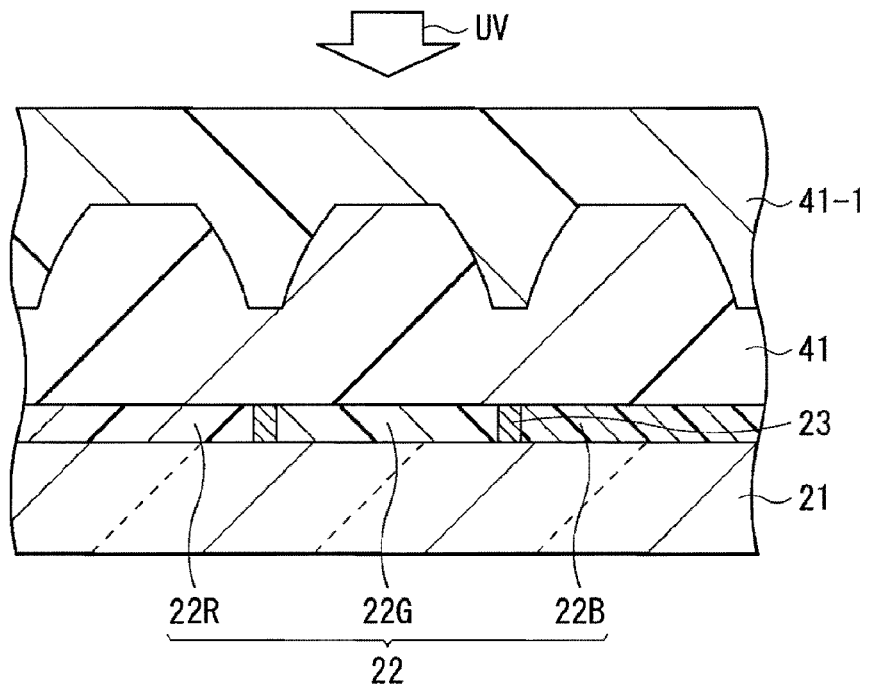
FIGS. 5A and 5B are sectional views illustrating steps following FIGS. 4A and 4B.

Next, as illustrated in FIG. 5A, the sealing panel 20 and the base 41 are bonded together so that the color filter 22 and a back surface (a surface where the projections 41a are not formed) of the base 41 face each other. At this time, alignment is performed so that each of the projections 41a of the base 41 and each of the color filters 22R, 22G and 22B face each other. Next, an ultraviolet ray UV is applied to the base 41 to cure the base 41.

Figure 5B:
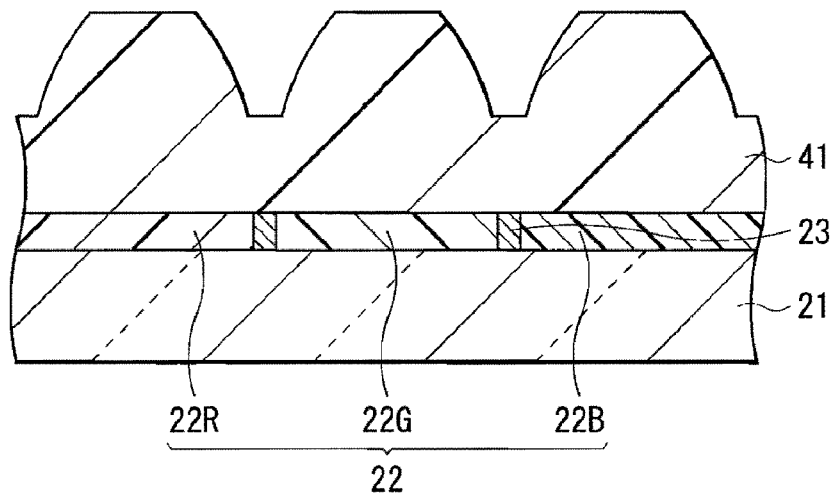

Next, as illustrated in FIG. 5B, the stamper 41-1 is removed. Thereby, the base 41 having the projections 41a is formed integrally and collectively on the color filter 22.

Figure 6A:
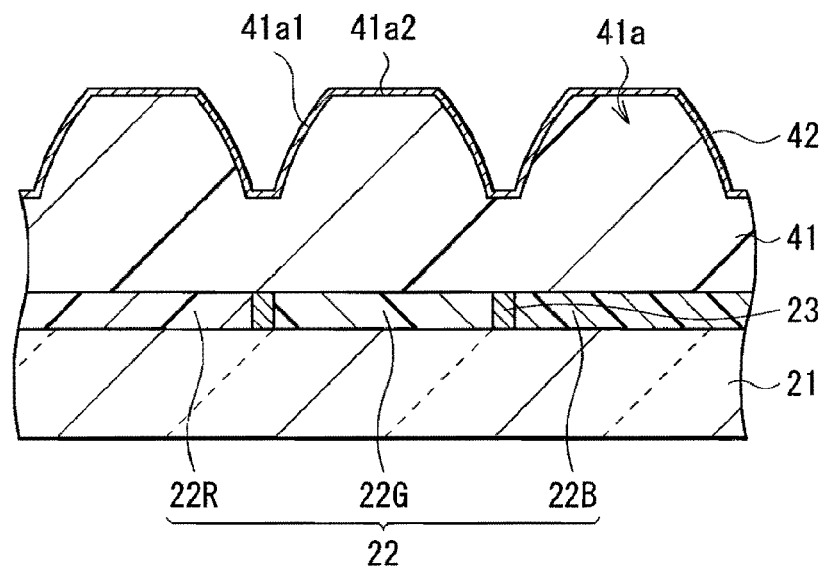
FIGS. 6A and 6B are sectional views illustrating steps following FIGS. 5A and 5B.

Then, as illustrated in FIG. 6A, the reflecting mirror film 42 made of the above-described material is formed by, for example, a vacuum deposition method, a sputtering method or a coating method so as to be laid over the surfaces of the projections 41a of the base 41. In addition, at this time, regions facing the end surfaces 41a2 of the projections 41a may be masked so as to prevent the reflecting mirror film 42 from being formed on these regions.

Figure 6B:
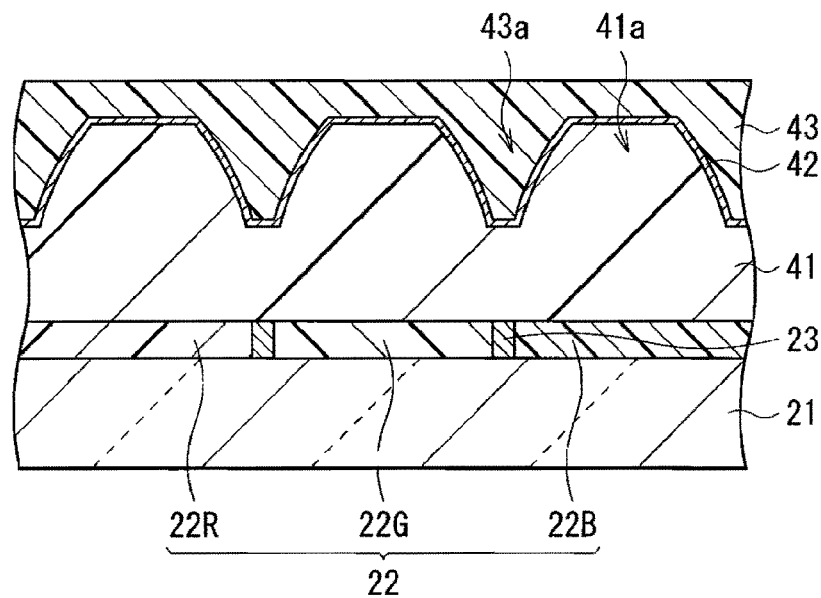

Next, as illustrated in FIG. 6B, the light absorption layer 43 made of the above-described material is formed on the surface of the formed reflecting mirror film 42 by coating so as to be embedded in the depressions 43a.

Figure 7:
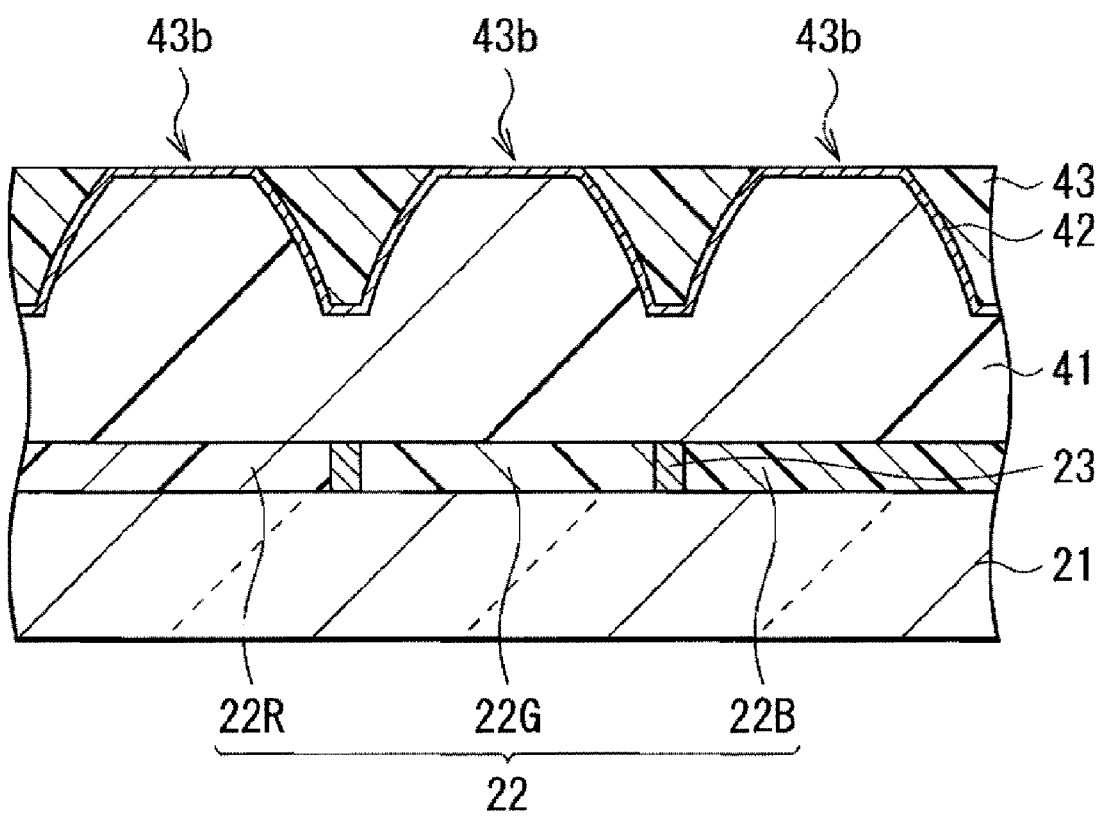
FIG. 7 is a sectional view illustrating a step following FIGS. 6A and 6B.

Then, as illustrated in FIG. 7, the surface of the light absorption layer 43 is polished by, for example, lapping to expose parts of the reflecting mirror film 42. Next, the exposed parts of the reflecting mirror film 42 are removed by, for example, wet etching or the like to form the openings 43b in regions facing the end surfaces 41a2 of the projections 41a. In addition, in a step of forming the above-described reflecting mirror film 42, in the case where the reflecting mirror film 42 is formed by masking the regions facing the end surfaces 41a2, only the light absorption layer 43 may be lapped. Thereby, the reflector 40 is integrally formed on the sealing panel 20.

Finally, the drive panel 10 and the sealing panel 20 are bonded together with the adhesive layer 30 in between so that the reflector 40 and the organic light-emitting devices 10R, 10G and 10B face each other. At this time, for example, the adhesive layer 30 is formed on the protective film 16 of the drive panel 10, and the drive panel 10 and the sealing panel 20 are bonded together so that the end surfaces 41a2 of the projections 41a in the reflector 40 face the organic light-emitting devices 10R, 10G and 10B, respectively. Thus, the light-emitting device 1 illustrated in FIG. 1 is completed.

Figure 8:
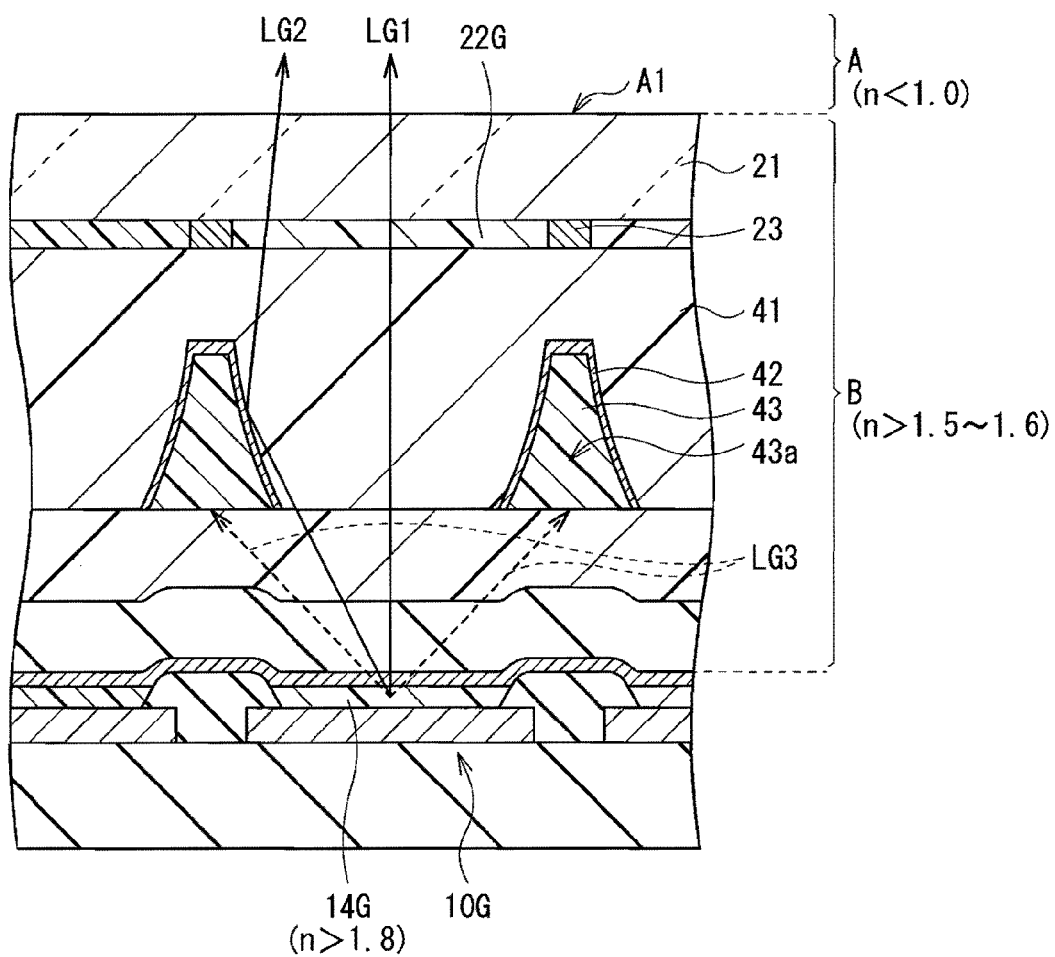
FIG. 8 is a schematic view illustrating an optical path of light emitted from an organic layer.

Next, functions and effects of the above-described light-emitting device 1 will be described referring to FIGS. 1 to 11A and 11B. FIG. 8 schematically illustrates an optical path of light emitted from a green organic layer 14G, and FIG. 11 is an illustration for describing a simulation of the embodiment.

In the light-emitting device 1, when a drive current is injected into each of the organic light-emitting devices 10R, 10G and 10B in response to a scanning signal supplied from the scanning line drive circuit 130 and an image signal supplied from the signal line drive circuit 120, holes and electrons are recombined in the organic layer 14 of each of the organic light-emitting devices 10R, 10G and 10B to emit light. The light is emitted to above the second electrode 15, and passes through the reflector 40, the color filters 22R, 22G and 22B and the sealing panel 20 in order to be extracted from the top of the sealing panel 20.

Now, referring to FIG. 8, light extraction in the light-emitting device 1 will be described in detail. However, for the purpose of facilitation, description will be given referring to the organic light-emitting device 10G of three organic light-emitting devices 10R, 10G and 10B. A part (LG1) of light emitted from the green organic layer 14G enters from the end surface 41a2 of the projection 41a in the reflector 40, and then travels inside the base 41 and passes through the color filter 22G, thereby the part of light is extracted from the top of the sealing substrate 21 to outside. On the other hand, the optical path of light with a large radiation angle, that is, light LG2 entering into the projection 41a at an angle equal to or larger than a predetermined angle in green light generated in the green organic layer 14G is converted by the reflecting mirror film 42 so that the incident angle of the light LG2 to an interface A1 is equal to or smaller than a critical angle, and then the light LG2 enters into the color filter 22G. Thereby, light extraction efficiency is improved.

Figure 9:
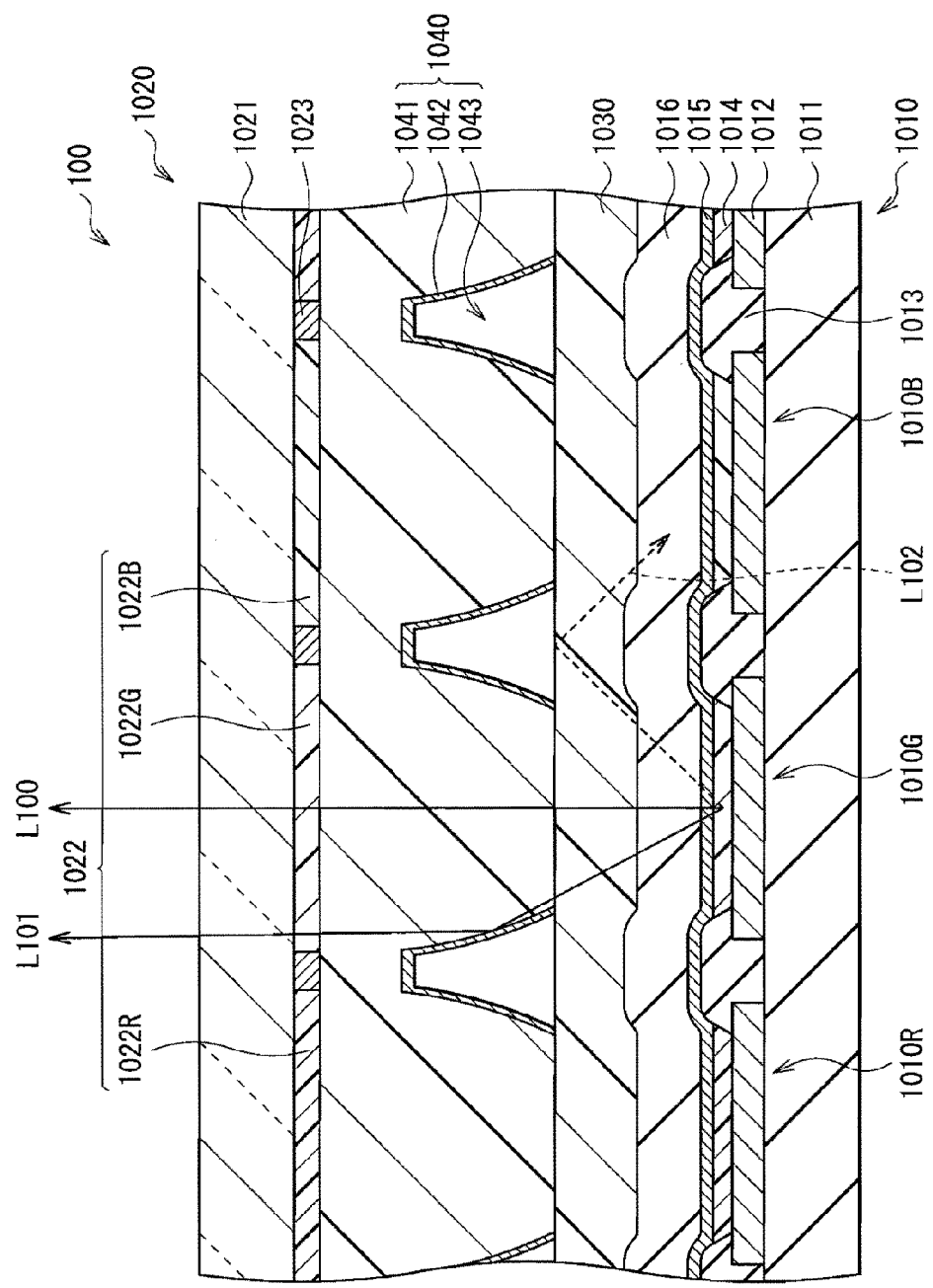
FIG. 9 is a sectional view illustrating an example of a light-emitting device according to Comparative Example 1.

Next, referring to FIG. 9, a light-emitting device 100 according to Comparative Example 1 will be described below. The light-emitting device 100 has a configuration that a drive panel 1010 in which organic light-emitting devices 1010R, 1010G and 1010B are formed on a drive substrate 1011 having a TFT (not illustrated) or the like formed thereon and a sealing panel 1020 in which a color filter 1022 is formed on a sealing substrate 1021 are bonded together with an adhesive layer 1030 in between. A reflector 1040 is arranged on the color filter 1022 side of the sealing panel 1020.

The organic light-emitting devices 1010R, 1010G and 1010B each have a configuration in which a first electrode 1012, an organic layer 1014 and a second electrode 1015 are laminated in order from the drive substrate 1011, and are covered with a protective layer 1016. The first electrode 1012 is patterned in each of the organic light-emitting devices 1010R, 1010G and 1010B, and the first electrodes 1012 of the organic light-emitting devices 1010R, 1010G and 1010B are electrically separated from one another by an insulating film 1013. In such a configuration, light is extracted from the second electrode 1015 (L100 and L101). The sealing panel 1020 is formed by arranging the color filter 1022 (including a red filter 1022R, a green filter 1022G and a blue filter 1022B) and a light-shielding film 1023 on the sealing substrate 1021. The reflector 1040 is formed by forming a reflecting mirror film 1042 on a surface of a base 1041 having a plurality of projections, and the projections are arranged so as to face the organic light-emitting devices 1010R, 1010G and 1010B, respectively.

In the reflector of the above-described Comparative Example 1, spaces between the plurality of projections form space layers 1043 having an atmosphere (for example, air, nitrogen or vacuum) at the time of sealing. In this case, a part of light emitted to the space layer 1043 is returned to the drive panel 1010 by total reflection at an interface with the space layer 1043 (L102), and then the light is further reflected by a wiring layer (for example, the first electrode 1012) or the like of the drive panel 1010. Such light is stray light, and causes degradation in display quality.

Figure 10:
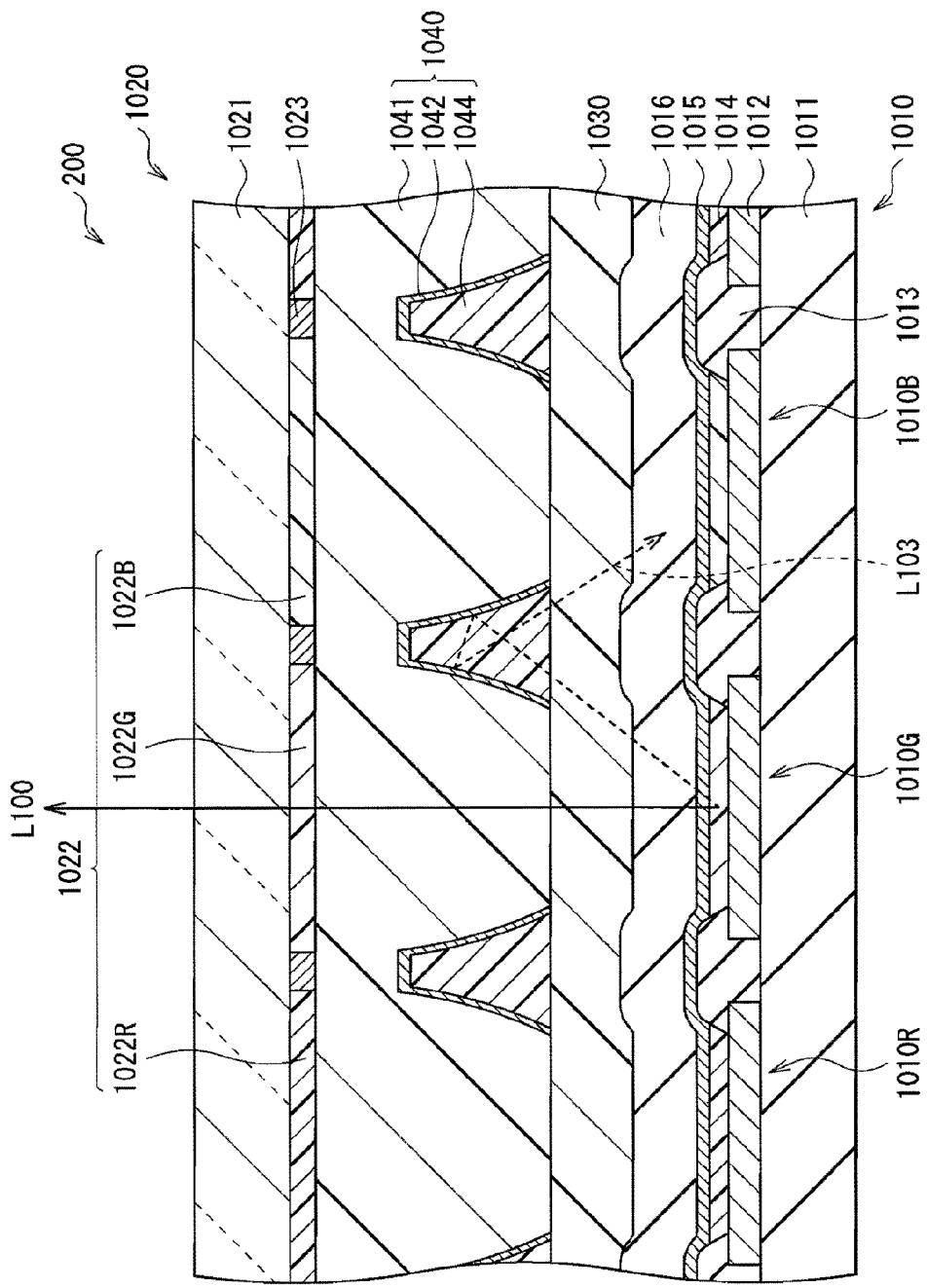
FIG. 10 is a sectional view illustrating another example of a light-emitting device according to Comparative Example 2.
Figure 11A:
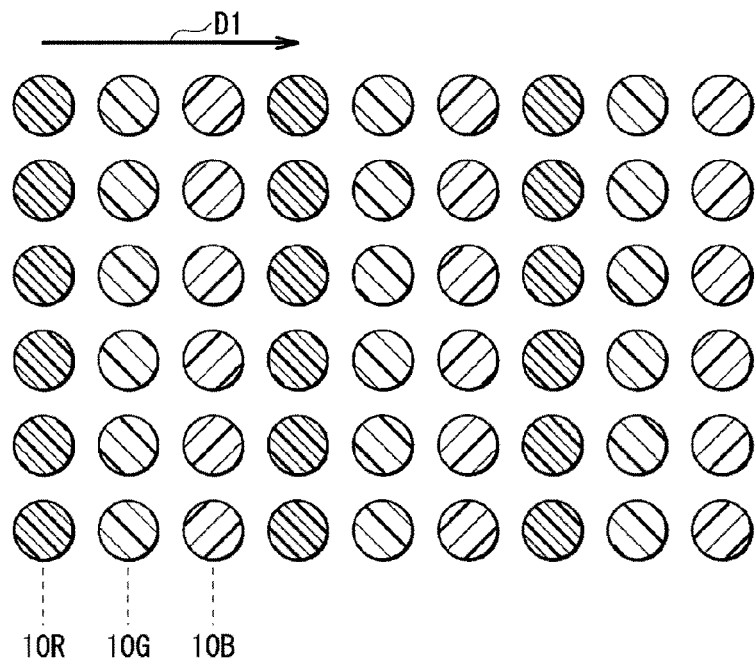
FIGS. 11A and 11B are illustrations for describing an evaluation system used in an implementation example.
Figure 11B:
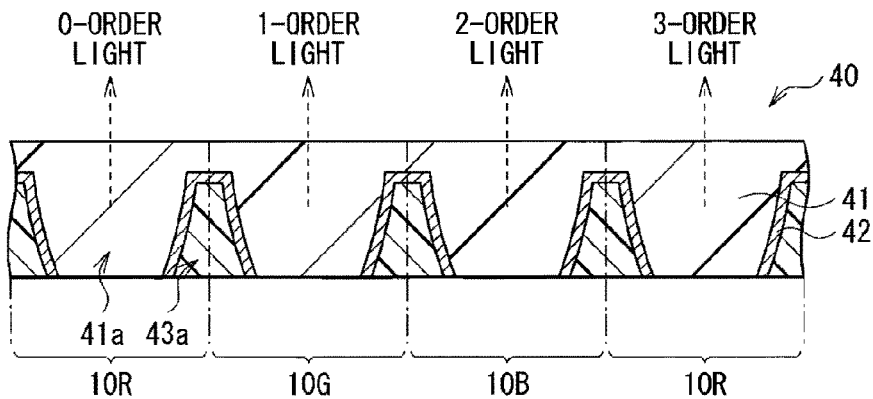

Moreover, FIG. 10 illustrates a sectional view of a light-emitting device 200 according to Comparative Example 2. In the drawing, like components are denoted by like numerals as of Comparative Example 1 in FIG. 9. The light-emitting device 200 has a configuration that transparent resin layers 1044 are formed in spaces between the projections in the reflector 1040. A configuration in which the transparent resin layers 1044 are embedded in the spaces between the plurality of projections may be considered. However, in this case, a part of light emitted to the transparent resin layer 1044 enters into the inside of the transparent resin layer 1044, and then the part of light is reflected on a back surface of the reflecting mirror film 1042 to be the above-described stray light (L103).

On the other hand, in the embodiment, light LG3 having entered into the depression 43a of the reflector 40 in the light emitted from the green organic layer 14G is absorbed by the light absorption layer 43 embedded in the depression 43a.

As described above, in the embodiment, the light absorption layer 43 is formed in the depressions 43a formed in spaces between the plurality of projections 41a in the reflector 40, so light entering into the depressions 43a of the reflector 40 is allowed to be absorbed by the light absorption layer 43. Thereby, total reflection at an interface in the case where the depressions are air layers, or reflection at the back surface of the reflecting mirror film in the case where the depressions are filled with the transparent resin layer is preventable. Therefore, the generation of stray light is preventable.

Moreover, as an implementation example of the embodiment, a simulation using an evaluation system illustrated in FIGS. 11A and 11B was performed. In this simulation, in a light-emitting device in which the organic light-emitting devices 10R, 10G and 10B were aligned in a pattern illustrated in FIG. 11A on the drive panel 10, 0-order light, 1-order light, 2-order light and 3-order light emitted from the organic light-emitting device 10R to above the reflector 40 along a direction indicated by an arrow D1 in the drawings were measured. More specifically, as illustrated in FIG. 11B, light $L_0$ emitted as it is from a projection 41a directly above an organic light-emitting device 10R in light emitted from the organic light-emitting device 10R was the 0-order light, and light $L_1$ emitted from a projection 41a in a site next to the organic light-emitting device 10R (an organic light-emitting device 10G) in the light emitted from the organic light-emitting device 10R was the 1-order light, and light $L_2$ emitted from a projection 41a in a site next to the organic light-emitting device 10G (an organic light-emitting device 10B) in the light emitted from the organic light-emitting device 10R was the 2-order light, and light $L_3$ emitted from a projection 41a in a site next to the organic light-emitting device 10B (another organic light-emitting device 10R) in the light emitted from the organic light-emitting device 10R was the 3-order light. Among them, the 1-order light, the 2-order light and the 3-order light were defined as stray light.

The 0-order light, the 1-order light, the 2-order light and the 3-order light were measured through the use of the above-described evaluation system in the case where the depressions 43a between the projections 41a in the reflector 40 were filled with a black resin material with an absorption ratio of 100% (Example 1), in the case where the depressions 43a were air layers (n=1) (Comparative Example 1) and in the case where the depressions 43a were filled with a transparent resin material with a transmittance of 100% (Comparative Example 2). The results are illustrated in Table 1 as ratios of the 0-order light, the 1-order light, 2-order light and 3-order light to the light emitted from the organic light-emitting device 10R (ratio to emitted light) and ratios of the 0-order light, the 1-order light, 2-order light and 3-order light to the 0-order light (ratio to 0-order light).

TABLE 1

| | EXAMPLE 1 BLACK RESIN (ABSORPTION RATIO 100%) | | COMPARATIVE EXAMPLE 1 AIR LAYER | | COMPARATIVE EXAMPLE 2 TRANPARENT RESIN (TRANSMITTANCE 100%) | |
|---|---|---|---|---|---|---|
| | RATIO TO EMITTED LIGHT | RATIO TO 0-ORDER LIGHT | RATIO TO EMITTED LIGHT | RATIO TO 0-ORDER LIGHT | RATIO TO EMITTED LIGHT | RATIO TO 0-ORDER LIGHT |
| 0-ORDER (EMITTED DIRECTLY ABOVE) | 73.9686% | 100.00000% | 73.9720% | 100.00000% | 73.9942% | 100.00000% |
| 1-ORDER (STRAY LIGHT) | 0.0708% | 0.09576% | 0.6416% | 0.86731% | 0.1184% | 0.16007% |
| 2-ORDER (STRAY LIGHT) | 0.0034% | 0.00465% | 0.0306% | 0.04132% | 0.0035% | 0.00466% |
| 3-ORDER (STRAY LIGHT) | 0.0006% | 0.00087% | 0.0039% | 0.00526% | 0.0006% | 0.00087% |

It was evident from Table 1 that in Example 1 in which the depressions 43a were filled with the black resin material, the ratios of the 1-order light, the 2-order light and 3-order light, that is, stray light were smaller than those in Comparative Example 1 in which the depressions 43a were air layers. Moreover, it was obvious that in Example 1, the ratio of the 1-order light was smaller than that in Comparative Example 2 in which the depressions 43a were filled with the transparent resin material. Therefore, it was confirmed that when the depressions 43a were filled with the black resin material, the generation of stray light was prevented.

Next, modifications of the embodiment will be described below. In the following description, like components are denoted by like numerals as of the light-emitting device 1 according to the embodiment, and will not be further described.

Modification 1

Figure 12:
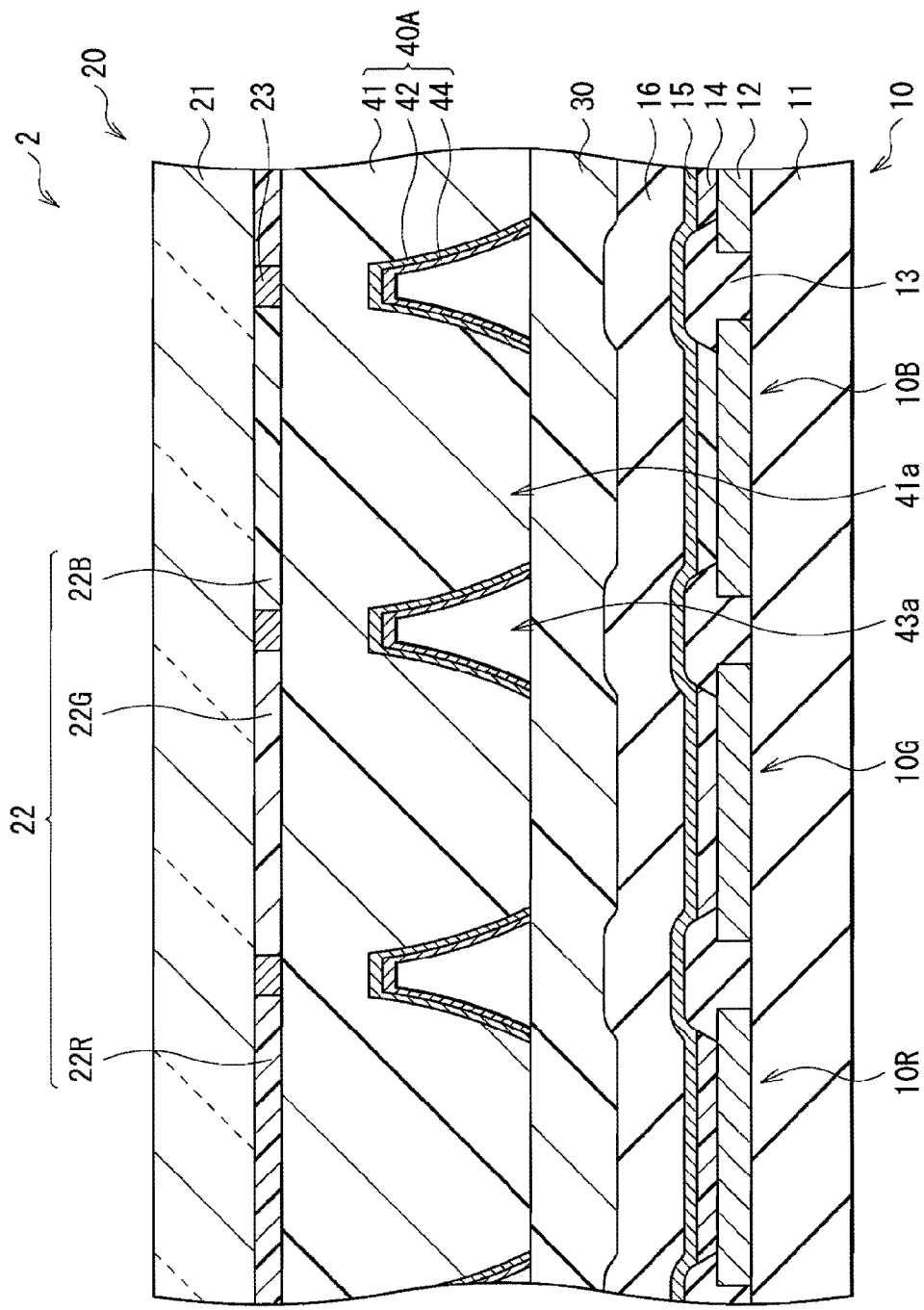
FIG. 12 is a schematic sectional view of a light-emitting device according to Modification 1.

FIG. 12 illustrates a sectional view of a light-emitting device 2 according to Modification 1. The light-emitting device 2 has the same configuration as that of the light-emitting device 1 according to the above-described embodiment except for the configuration of a light absorption layer 44 in a reflector 40A. More specifically, in the reflector 40A, the reflecting mirror film 42 is formed on the side surfaces 41a1 of the plurality of projections 41a in the base 41, and the light absorption layer 44 is formed in the depressions 43a so as to be laid over the reflecting mirror film 42 along a planar shape of the reflecting mirror film 42. The light absorption layer 44 has, for example, a thickness of 1.0 μm to 15 μm, and is made of the same material as that of the light absorption layer 43 in the above-described embodiment. However, the thickness of the light absorption layer 44 depends on the absorption ratio of the material, but the thickness of the light absorption layer 44 is preferably 200 nm or over.

Figure 13A:
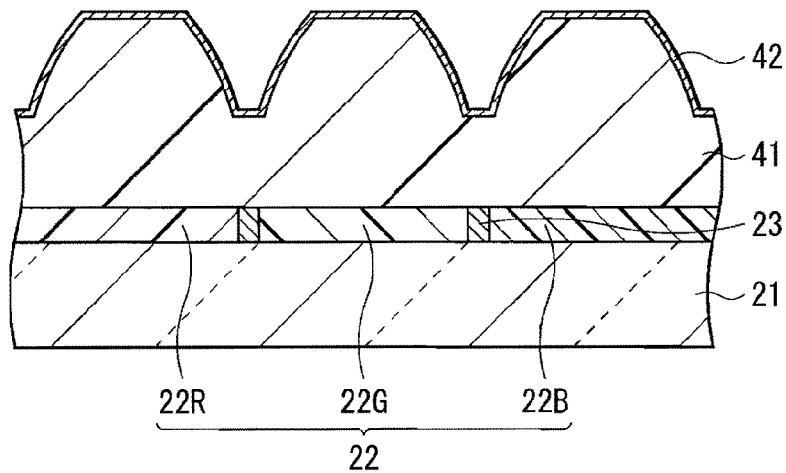
FIGS. 13A and 13B are sectional views illustrating a method of manufacturing the light-emitting device illustrated in FIG. 12 in order of steps.

Moreover, for example, such a light-emitting device 2 is manufactured by the following steps. For example, as in the case of the above-described embodiment, while the drive panel 10 is formed, the reflecting mirror film 42 is formed on surfaces of the projections 41a of the base 41 on the color filter 22 of the sealing panel 20 (refer to FIG. 13A). At this time, in the case where a film formation apparatus is an apparatus in which a plurality of targets are mounted, the reflecting mirror film 42 is formed, and then the light absorption layer 42 is subsequently formable.

Figure 13B:
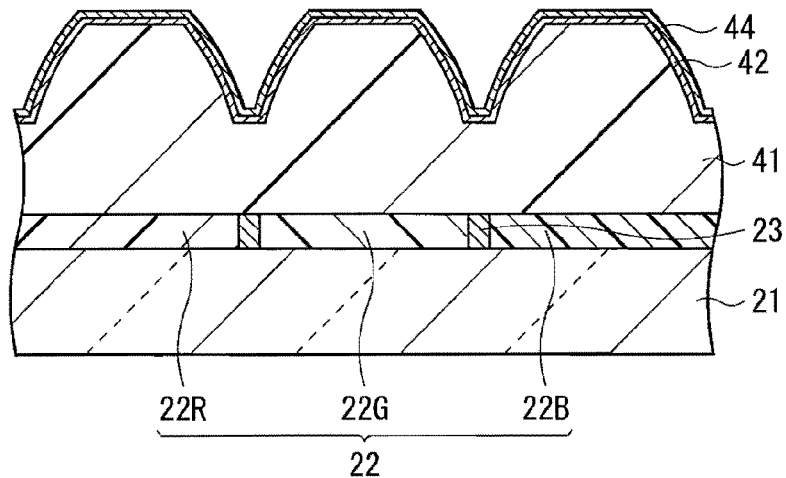

Next, as illustrated in FIG. 13B, the light absorption layer 44 is formed of the above-described material, for example, carbon by, for example, a sputtering method or the like. In addition, a mask may be used so as not to form the reflecting mirror film 42 and the light absorption layer 44 in regions facing the end surfaces 41a2 of the projections 41a.

Figure 14:
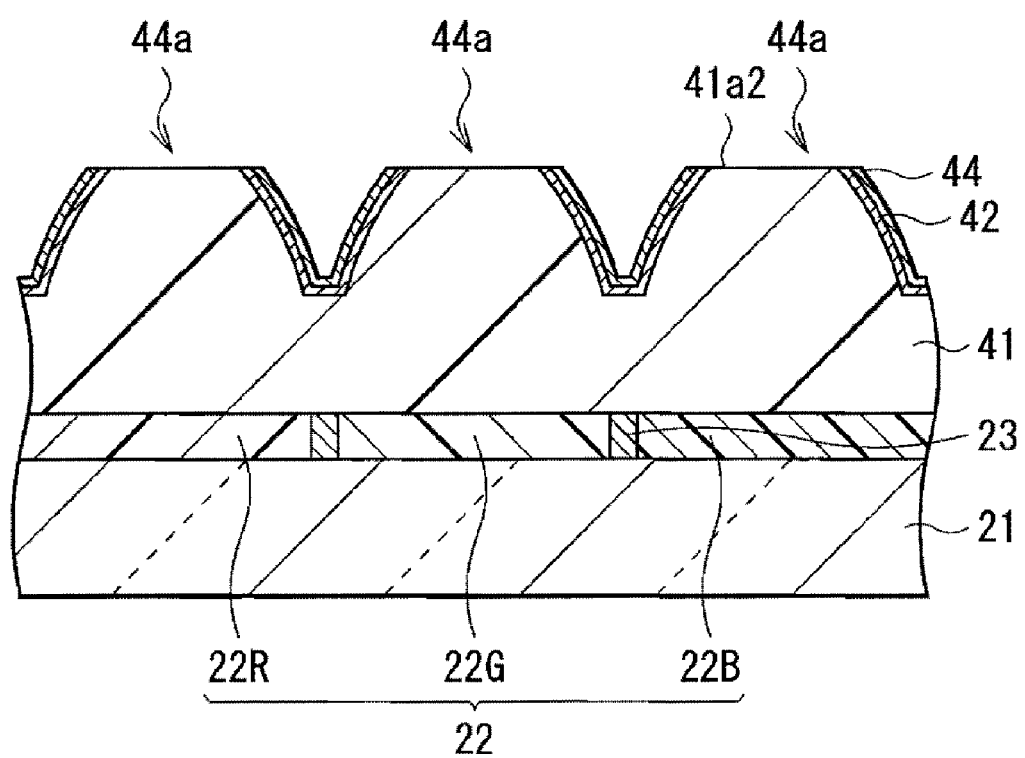
FIG. 14 is a sectional view illustrating a step following FIGS. 13A and 13B.

Next, as illustrated in FIG. 14, the openings 44a are formed in the regions facing the end surfaces 41a2 of the projections 41a by the same method as that in the above-described embodiment. Finally, as in the case of the above-described embodiment, the drive panel 10 and the sealing panel 20 on which the reflector 40A is formed are bonded together to complete the light-emitting device 2 illustrated in FIG. 12.

Thus, in the depressions 43a, the back surface of the reflecting mirror film 42 may be covered with the light absorption layer 44. Also in such a configuration, light entering into the depressions 43a is absorbed by the light absorption layer 44 arranged on the back surface of the reflecting mirror film 42. Therefore, effects equivalent to the effects in the above-described embodiment are obtainable.

Modification 2

Figure 15:
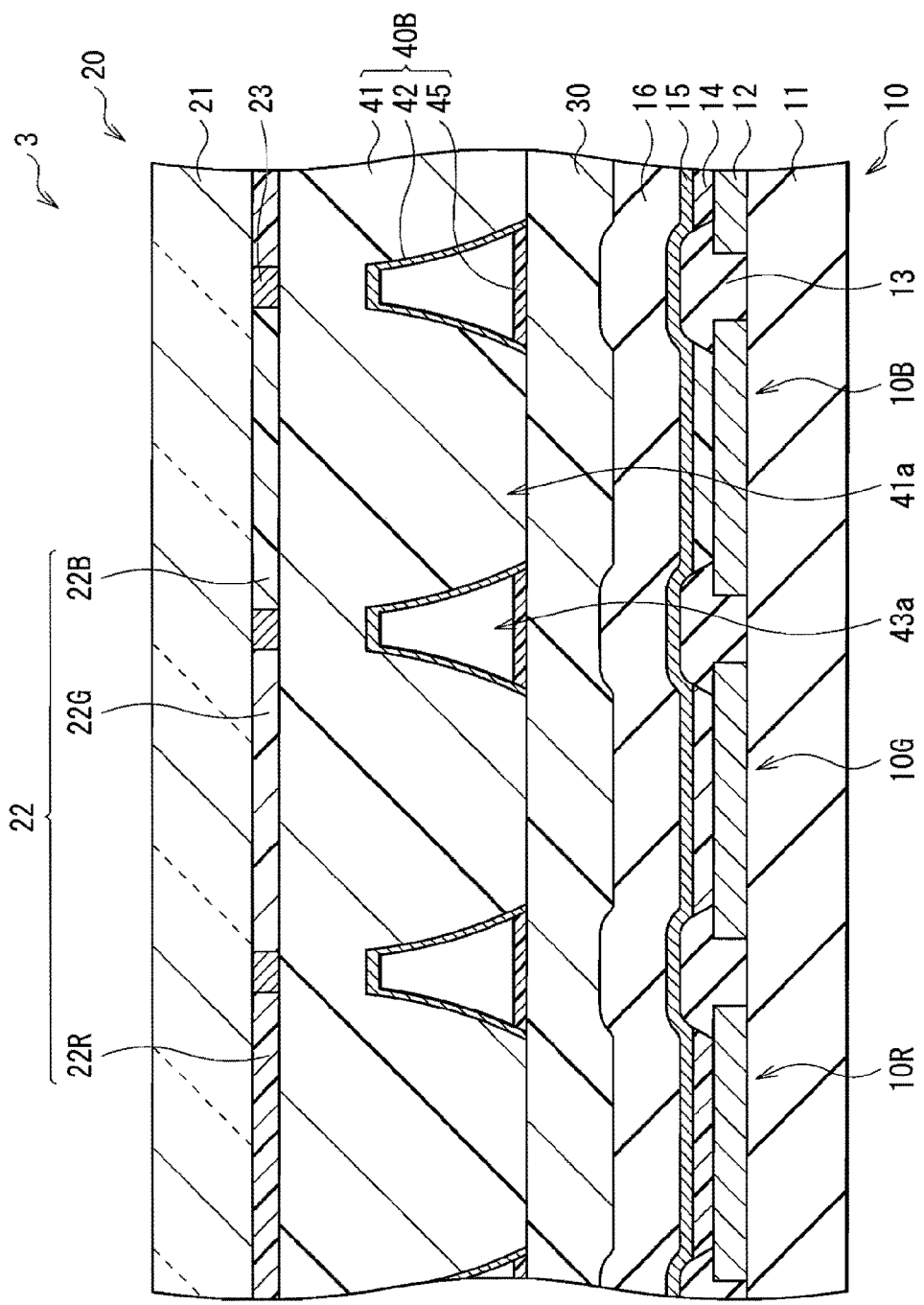
FIG. 15 is a schematic sectional view of a light-emitting device according to Modification 2.

FIG. 15 illustrates a sectional view of a light-emitting device 3 according to Modification 2. The light-emitting device 3 has the same configuration as that of the light-emitting device 1 according to the above-described embodiment except for the configuration of a light absorption layer 45 in a reflector 40B. More specifically, in the reflector 40B, the reflecting mirror film 42 is formed on the side surfaces 41a1 of the plurality of projections 41a in the base 41, and in the depressions 43a, the light absorption layer 45 is formed separately from the reflecting mirror film 42. For example, the light absorption layer 45 is arranged on a side close to the adhesive layer 30 in the depressions 43a. The light absorption layer 45 is formed of the same material as that of the light absorption layer 44 in Modification 1 with the same thickness as that of the light absorption layer 44 in Modification 1. Moreover, such a light absorption layer 45 may be formed on a surface of the adhesive layer 30 by patterning on, for example, a black resist for a black matrix of a color filter or the like by, for example, an ink jet method.

Thus, in the depressions 43a, the light absorption layer 45 may be formed separately from the reflecting mirror film 42. Also, in such a configuration, light intended to enter into the depressions 43a is absorbed by the light absorption layer 45. Therefore, effects equivalent to the effects in the above-described embodiment are obtainable. Moreover, compared to the above-described embodiment and Modification 1, the formation area of the light absorption layer 45 is smaller, and it is only necessary to perform patterning only on a necessary part, so the light-emitting device 3 has an advantage that a smaller amount of the black resin material is used.

MODULE AND APPLICATION EXAMPLES

Application examples of the light-emitting devices described in the above-described embodiment and the above-described modifications will be described below. The light-emitting device according to the above-described embodiment is applicable to displays of electronic devices displaying a picture signal inputted from outside or a picture signal produced inside as an image or a picture in any fields, such as televisions, digital cameras, notebook personal computers, portable terminal devices such as cellular phones, and video cameras.

Modules

Figure 16:
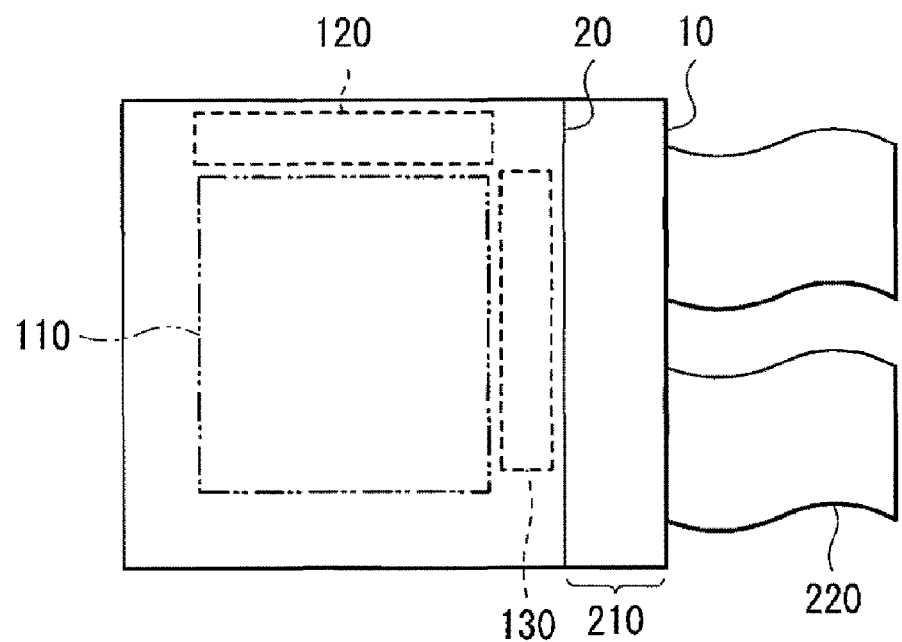
FIG. 16 is a schematic plan view of a module including the light-emitting device according to the above-described embodiment.

The light-emitting device according to the above-described embodiment or the like is incorporated into various electronic devices such as Application Examples 1 to 5 which will be described later as a module as illustrated in FIG. 16. In the module, for example, a region 210 exposed from the sealing panel 20 and the adhesive layer 30 is arranged on a side of the drive substrate 11, and an external connection terminal (not illustrated) is formed in the exposed region 210 by extending the wiring of the signal line drive circuit 120 and the scanning line drive circuit 130. In the external connection terminal, a flexible printed circuit (FPC) 220 for signal input/output may be arranged.

Application Example 1

Figure 17:
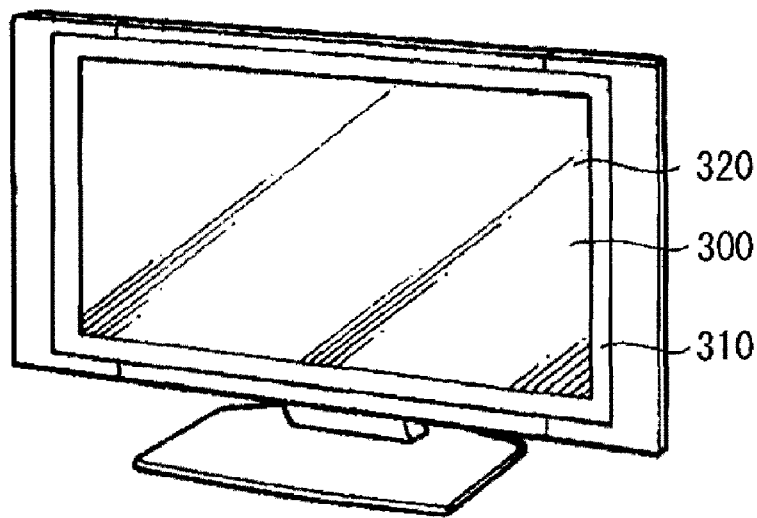
FIG. 17 is an external perspective view of Application Example 1 of the light-emitting device according to the above-described embodiment.

FIG. 17 illustrates an appearance of a television to which the light-emitting device according to the above-described embodiment or the like is applied. The television has, for example, a picture display screen section 300 including a front panel 310 and a filter glass 320. The picture display screen section 300 is composed of the light-emitting device according to the above-described embodiment or the like.

Application Example 2

Figure 18A:
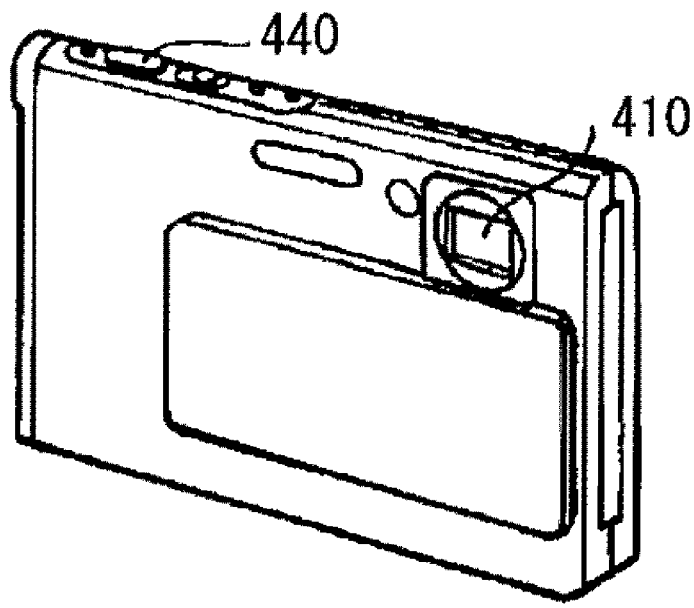
FIGS. 18A and 18B are an external perspective view from the front side of Application Example 2 and an external perspective view from the back side of Application Example 2, respectively.
Figure 18B:
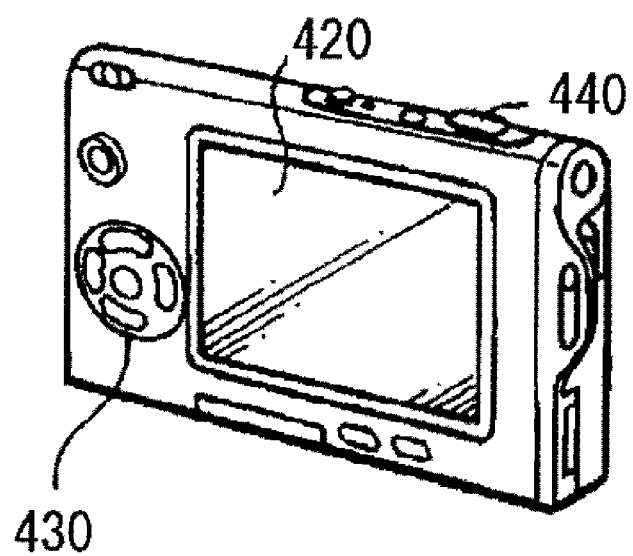

FIGS. 18A and 18B illustrate appearances of a digital camera to which the light-emitting device according to the above-described embodiment or the like is applied. The digital camera has, for example, a light-emitting section for a flash 410, a display section 420, a menu switch 430, and a shutter button 440. The display section 420 is composed of the light-emitting device according to the embodiment or the like.

Application Example 3

Figure 19:
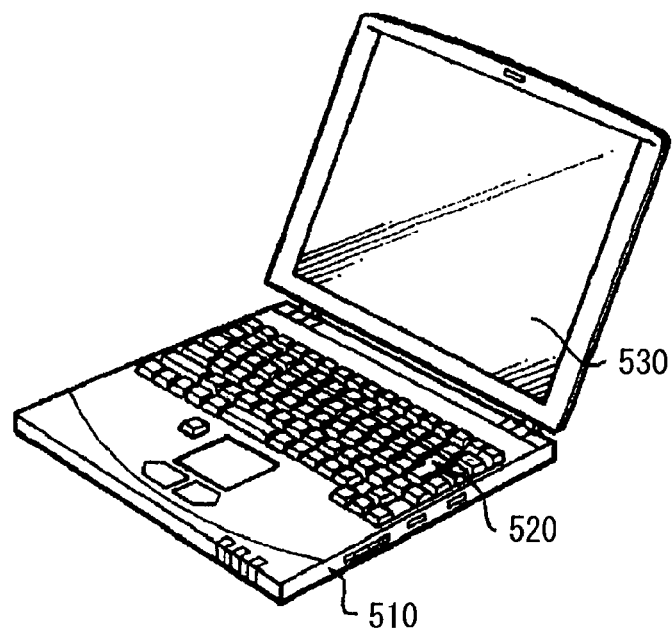
FIG. 19 is an external perspective view of Application Example 3.

FIG. 19 illustrates an appearance of a notebook personal computer to which the light-emitting device according to the above-described embodiment or the like is applied. The notebook personal computer has, for example, a main body 510, a keyboard 520 for operation of inputting characters and the like, a display section 530 for displaying an image. The display section 530 is composed of the light-emitting device according to the above-described embodiment or the like.

Application Example 4

Figure 20:
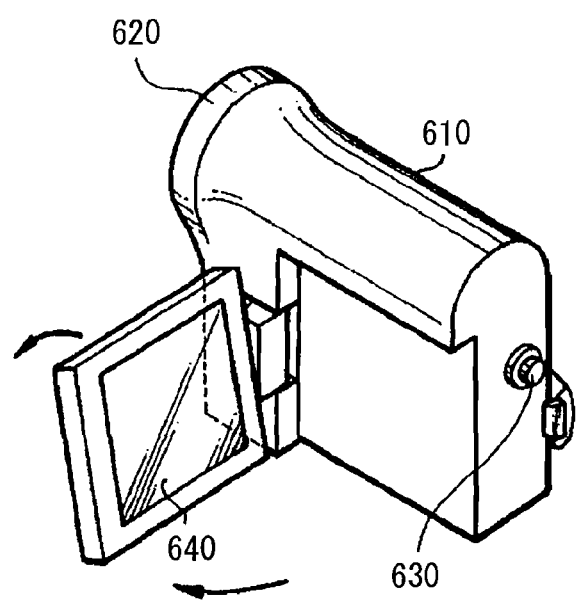
FIG. 20 is an external perspective view of Application Example 4.

FIG. 20 illustrates an appearance of a video camera to which the light-emitting device according to the above-described embodiment or the like is applied. The video camera has, for example, a main body 610, a lens for shooting an object 620 arranged on a front surface of the main body 610, a shooting start/stop switch 630, and a display section 640. The display section 640 is composed of the light-emitting device according to the above-described embodiment or the like.

Application Example 5

FIGS. 21A to 21G illustrate appearances of a cellular phone to which the light-emitting device according to the above-described embodiment or the like is applied. The cellular phone is formed by connecting, for example, a top-side enclosure 710 and a bottom-side enclosure 720 to each other by a connection section (hinge section) 730. The cellular phone has a display 740, a sub-display 750, a picture light 760, and a camera 770. The display 740 or the sub-display 750 is composed of the light-emitting device according to the above-described embodiment or the like.

Although the present application is described referring to the embodiment, the invention is not limited thereto, and may be variously modified. For example, the material and thickness of each layer, the method and conditions of forming each layer are not limited to those described in the above-described embodiment, and each layer may be made of any other material with any other thickness by any other method under any other conditions.

Moreover, in the above-described embodiment or the like, when the reflector 40 is formed, the stamper for transfer is formed by forming the reverse pattern of the projections 41a on the polycarbonate master by a mask imaging method. However, a method of forming the stamper is not limited thereto. For example, the following methods (1) to (4) may be used. In addition, a resin material used for the base 41 depends on the material of the used stamper. For example, in the case where a Zeonor (trademark) stamper in the method (2) is used, the Zeonor (trademark) stamper has a good peeling property from resins, so various kinds of UV curable resins are used.

(1) Method of obtaining a nickel (Ni) electroforming stamper by forming nickel electroforming with a polycarbonate master (2) Method of obtaining a Zeonor (trademark) stamper by thermally transferring a pattern to a Zeonor (trademark) film with a Ni electroforming stamper (3) Method of directly forming a pattern on a substrate made of polycarbonate, metal or the like as a stamper by cutting by a cutting tool, a focused laser or the like (4) Method of directly forming a pattern on a substrate as a stamper by a photolithography technique Moreover, in the above-described embodiment or the like, the case where the pattern of the projections in the reflector 40 is formed by a technique of transferring with a stamper is described as an example. However, the technique of forming the pattern of the reflector 40 is not limited thereto. For example, first, a glass substrate is coated with a photoresist, and then the photoresist is patterned by a photolithography technique to form a mother die on which a reverse pattern of the projections are formed on the glass substrate. Next, a mold made of nickel (Ni) is formed by electroforming with the mother die. The base 41 may be formed by step and flash imprinting or thermal imprinting using the mold formed in such a manner. In the case of the step and flash imprinting, first, a resin layer made of an UV curable resin is formed on a glass substrate, and then the resin layer comes in contact with a mold, and UV light is applied to the resin layer which keeps in contact with mold. After that, the mold is removed from the resin layer, thereby the base 41 having the projections 41a on a surface thereof is formed. In the case of the thermal imprinting, first, PDMS (Poly-Dimethyl-Siloxane) is injected into a mold, and PDMS is cured with heat. After that, PDMS is removed from the mold, thereby the base 41 having the projections 41a on a surface thereof is formed.

Moreover, in the above-described embodiment or the like, a configuration in which a part on the back surface side (the color filter side) of the reflector is thick is described as an example, but the invention is not limited thereto, and a configuration in which a part on the back surface side of the reflector is not thick may be used. Further, a configuration in which flat surfaces are arranged between the projections is illustrated, but the invention is not limited thereto, and a configuration in which the projections are formed in contact with one another so as not to form flat surfaces between the projections may be used.

Further, in the above-described embodiment or the like, the configurations of the organic light-emitting devices 10R, 10B and 10G are specifically described. However, all layers are not necessarily included, or any other layer may be further included.

The invention is applicable to not only the organic light-emitting device but also any other self-luminous device such as an LED (Light Emitting Diode), an FED (Field Emission Display) or an inorganic electroluminescence device.

Further, in the above-described embodiment or the like, the case where the light-emitting device of the invention is applied to a display is described. However, the light-emitting device of the invention is applicable to any light-emitting device for any purpose other than the display, such as a lighting device.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light-emitting device comprising:
a light-emitting panel including a plurality of self-luminous devices on a substrate; and
a reflection plate arranged on a light extraction side of the light-emitting panel,
wherein the reflection plate includes:
a base having light transparency, and having projections corresponding to the plurality of self-luminous devices in the light-emitting panel,
a reflecting mirror film formed along a side surface of each of the projections in the base; and
a light absorption layer arranged in a part or the whole of each of depressions on the surface of the base, the depressions being formed in spaces between the plurality of projections.

2. The light-emitting device according to claim 1, wherein a color filter is arranged on a back surface of the base in the reflection plate.

3. The light-emitting device according to claim 1, wherein the light absorption layer is embedded in the depressions.

4. The light-emitting device according to claim 1, wherein the light absorption layer is formed in the depressions so as to be laid over the reflecting mirror film along a planar shape of the reflecting mirror film.

5. The light-emitting device according to claim 1, wherein the light absorption layer is formed in the depressions separately from the reflecting mirror film.

6. The light-emitting device according to claim 1, wherein the light absorption layer is made of a black resin material.

7. The light-emitting device according to claim 1, wherein a side surface of each of the projections has the shape of a rotationally symmetrical paraboloid.

8. A reflection plate comprising:
a base having light transparency, and having a plurality of projections formed on a surface thereof;
a reflecting mirror film arranged so as to be laid over a side surface of each of the projections in the base; and
a light absorption layer arranged in a part or the whole of each of depressions on the surface of the base, the depressions being formed in spaces between the plurality of projections.

9. The reflection plate according to claim 8, wherein the light absorption layer is embedded in the depressions.

10. The reflection plate according to claim 8, wherein the light absorption layer is formed in the depressions so as to be laid over the reflecting mirror film along a planar shape of the reflecting mirror film.

11. The reflection plate according to claim 8, wherein the light absorption layer is formed in the depressions separately from the reflecting mirror film.

12. The reflection plate according to claim 8, wherein the light absorption layer is made of a black resin material.

13. The reflection plate according to claim 8, wherein a side surface of each of the projections has the shape of a rotationally symmetrical paraboloid.

* * * * *